US011302590B2

(12) United States Patent
Saerchen et al.

(10) Patent No.: US 11,302,590 B2
(45) Date of Patent: Apr. 12, 2022

(54) DELIVERY OF LIGHT INTO A VACUUM CHAMBER USING AN OPTICAL FIBER

(71) Applicant: KLA CORPORATION, Milpitas, CA (US)

(72) Inventors: Emanuel Saerchen, Giessen (DE); Donald W. Pettibone, San Jose, CA (US); Oscar Florendo, Hollister, CA (US); Li-Min Chen, San Jose, CA (US); Martin Brutsch, San Jose, CA (US)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 16/691,843

(22) Filed: Nov. 22, 2019

(65) Prior Publication Data

US 2020/0266116 A1  Aug. 20, 2020

Related U.S. Application Data

(60) Provisional application No. 62/806,208, filed on Feb. 15, 2019.

(51) Int. Cl.
*H01L 21/66* (2006.01)
*G01R 31/311* (2006.01)
*H01L 21/67* (2006.01)
*G01N 21/95* (2006.01)

(52) U.S. Cl.
CPC ......... *H01L 22/34* (2013.01); *G01N 21/9505* (2013.01); *G01R 31/311* (2013.01); *H01L 21/67288* (2013.01)

(58) Field of Classification Search
CPC .............. G01N 21/9505; G01R 31/311; H01L 21/67288; H01L 22/34
See application file for complete search history.

(56) References Cited

U.S. PATENT DOCUMENTS

| 4,902,967 | A  | 2/1990  | Flesner |
| 6,507,388 | B2 | 1/2003  | Burghoorn |
| 7,006,215 | B2 | 2/2006  | Hoff et al. |
| 7,058,252 | B2 | 6/2006  | Woodgate et al. |
| 7,436,867 | B2 | 10/2008 | McDonald et al. |

(Continued)

FOREIGN PATENT DOCUMENTS

| CN | 101483307 A  | 7/2009 |
| CN | 201946871 U  | 8/2011 |

(Continued)

OTHER PUBLICATIONS

Zhao et al., Optical Beam Enhanced Defect Detection with Electron Beam Inspection Tools, Int'l Symposium on Semiconductor Manufacturing (ISSM),, 2008 abstract.

(Continued)

*Primary Examiner* — Deoram Persaud
(74) *Attorney, Agent, or Firm* — Hodgson Russ LLP (57) ABSTRACT

A system for laser enhanced voltage contrast using an optical fiber is provided. The system includes a vacuum chamber with a stage that secures a wafer. A laser light source outside the vacuum chamber directs light to an optical fiber. The optical fiber transmits all wavelengths of light from the laser light source into the vacuum chamber through a wall of the vacuum chamber.

18 Claims, 6 Drawing Sheets

(56) References Cited

U.S. PATENT DOCUMENTS

| | | |
|---|---|---|
| 7,884,024 B2 | 2/2011 | Le Roy et al. |
| 8,173,948 B2 | 5/2012 | Tsao |
| 9,711,950 B2 | 7/2017 | Zimer et al. |
| 2003/0007539 A1 | 1/2003 | Sell et al. |
| 2004/0247271 A1 | 12/2004 | Skovgaard et al. |
| 2005/0254752 A1 | 11/2005 | Domash et al. |
| 2011/0150026 A1* | 6/2011 | Tsunekane .............. F02P 23/04 372/75 |
| 2011/0194101 A1* | 8/2011 | Tachizaki ........... G01N 23/2251 356/72 |
| 2013/0113925 A1* | 5/2013 | Kim ................... G01B 9/02027 348/135 |
| 2015/0185623 A1* | 7/2015 | Yamaguchi ......... G03F 7/70616 355/67 |
| 2020/0203916 A1* | 6/2020 | Iguchi ................ G01N 21/3504 |
| 2020/0363469 A1* | 11/2020 | Chen ....................... H01J 37/28 |

FOREIGN PATENT DOCUMENTS

| | | |
|---|---|---|
| JP | S61180492 A | 8/1986 |
| WO | 2015149926 A1 | 9/2015 |

OTHER PUBLICATIONS

Kim et al., "Polarization-insensitive multi-wavelength switching based on polarization-selective long-period fiber gratings," Optics Express, 2004, vol. 12, No. 24, pp. 6082-6087.

Chen et al., "Switchable multi-wavelength fiber ring laser based on a compact in-fiber Mach-Zehnder interferometer with photonic crystal fiber," Laser Physics, Nov. 2009, 19:2115, abstract.

WIPO, ISR for PCT/US2019/063810, Mar. 20, 2020.

* cited by examiner

DELIVERY OF LIGHT INTO A VACUUM CHAMBER USING AN OPTICAL FIBER

CROSS-REFERENCE TO RELATED APPLICATIONS

This application claims priority to the provisional patent application filed Feb. 15, 2019 and assigned U.S. App. No. 62/806,208, the disclosure of which is hereby incorporated by reference.

FIELD OF THE DISCLOSURE

This disclosure relates to optical fiber delivery systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Laser enhanced voltage contrast (LEVC) has been used with scanning electron microscopes (SEMs). For example, two different voltage contrast effects can be changed favorably under illumination. This enables detection of defects that would otherwise not be detectable at the high speeds that SEM inspection requires.

Previously, an optical window provided the junction between air and vacuum. Different free space laser beams with fixed wavelength were applied individually one after another. Switching the wavelength required changing the lasers with subsequent optical realignment. No polarization variation was possible. Since the wavelengths being used were not combined, switching between the wavelengths was time-consuming. Due to use of the optical window, a straight direction from the light source to the region of interest was needed.

Feedthroughs for optical fibers connected with a vacuum chamber also have been problematic. Previously, several O-rings were used to form a seal. This exerted radial force on the optical fiber to create a vacuum barrier. However, compressive force (e.g., axial or radial) exerted on the optical fiber resulted in transmission loss. This transmission loss is especially noticeable in the visible red wavelength.

A polymer around the optical fiber was used instead of O-rings, but this did not provide sufficient hermetic sealing. The polymer had a leak rate higher than is needed for many manufacturing applications, including semiconductor inspection.

Therefore, improved systems are needed.

BRIEF SUMMARY OF THE DISCLOSURE

An apparatus is provided in a first embodiment. The apparatus includes a vacuum chamber; a stage disposed in the vacuum chamber that is configured to secure a wafer; a laser light source disposed outside the vacuum chamber; an optical fiber that transmits all wavelengths of light produced by the laser light source into the vacuum chamber through a wall of the vacuum chamber; and an achromatization and polarization unit.

The apparatus can include an electron beam source that directs an electron beam at the stage.

The optical fiber can transmit light at a wavelength from 200 nm to 2000 nm.

The laser light source can include a plurality of lasers and a plurality of dichroic mirrors.

The laser light source can further include a plurality of lasers, a polarization-dependent beam splitters, and a plurality of half-wave plates.

The optical fiber may be a multi-mode fiber or a single-mode fiber.

The apparatus can further include a wave plate disposed in the vacuum chamber that receives the light from the optical fiber. The wave plate can be a half-wave or a quarter-wave plate.

The achromatization and polarization unit can include a turning mirror disposed in the vacuum chamber and at least one achromatized lens disposed in the vacuum chamber. The turning mirror receives the light from the optical fiber and is configured to direct the light from the optical fiber at the stage. The achromatized lens is configured to collimate the light received from the optical fiber and/or image the light onto the wafer.

The achromatization and polarization unit an includes a curved mirror, which may be spherical or parabolic.

The light from the laser light source may be at more than one wavelength.

The apparatus can further include a flange around the optical fiber. The flange can be disposed in the wall of the vacuum chamber. In an instance, the flange can include an outer component disposed around the optical fiber and a polymer layer disposed between the optical fiber and the outer component. The polymer layer can be radially compressed to form a hermetic seal. The hermetic seal between the wall and the tube can further include using a metal-to-metal seal.

In another instance, the flange is an elastomer seal. The elastomer seal can be radially compressed to form a hermetic seal.

A method is provided in a second embodiment. The method comprises directing light from a laser light source to a vacuum chamber through an optical fiber. The optical fiber transmits all wavelengths of light produced by the laser light source into the vacuum chamber through a wall of the vacuum chamber. The light is directed to an achromatization and polarization unit in the vacuum chamber. The light is directed to a wafer secured on a stage disposed in the vacuum chamber.

The method can further include directing an electron beam in the vacuum chamber at the wafer.

The light can have a wavelength from 200 nm to 2000 nm.

The achromatization and polarization unit can include a turning mirror or a curved mirror.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Voltage contrast effects in an electron beam image can be changed on certain features of a wafer (e.g., integrated circuits) by exposing the electron beam image region to light while imaging. The electron beam can be, for example, part of a scanning electron microscope (SEM). In an instance, open tungsten contacts can be detected while under laser illumination for n+ contacts in a p-doped region. This laser enhanced voltage contrast (LEVC) can be generated in an electron beam tool at an angle of incidence of, for example, 57°. While 57° is used in one example, normal or other oblique angles can be used. Using wavelength from blue to the red visible spectrum can lead to different penetration depths into the wafer where the effect is generated.

The embodiments disclosed herein include an optical fiber to guide multiple wavelengths in the visible spectrum from blue (400 nm) to red (685 nm). The optical fiber can guide other wavelengths, such as a wavelength in a range from ultraviolet (e.g., 10 nm or 200 nm) or infrared (e.g., 700 nm) up to 2000 nm wavelengths. The light source or sources can be positioned outside of the vacuum column. The optical fiber transports the light to the inside of the vacuum column. Achromatized optics can be used to illuminate the desired region of interest of the wafer homogeneous over the broad wavelength range. Additionally, the polarization orientation of the laser light can be adapted to enhance the LEVC effect.

The embodiments of the multi-wavelength system disclosed herein can be used for LEVC application on an electron beam inspection or electron beam review tool, such as those used in the semiconductor industry or in other industries. The system can use fiber optics and a laser combiner module. The system can use free space lasers and dichroic filters. The delivery optics can provide approximately the same spot size, regardless of wavelength.

The delivery optics also can provide polarization control of the incident light and modulation capabilities that allow the illumination to be turned on and off on a frame-by-frame basis, on a line-by-line basis, or a pixel-by-pixel basis. Turning the laser on and off to provide this feature can be linked to the electron beam such that the light and the electron beam work in a coordinated manner. The contrast and/or wavelength can be adjusted at different points on the wafer.

Figure 1:
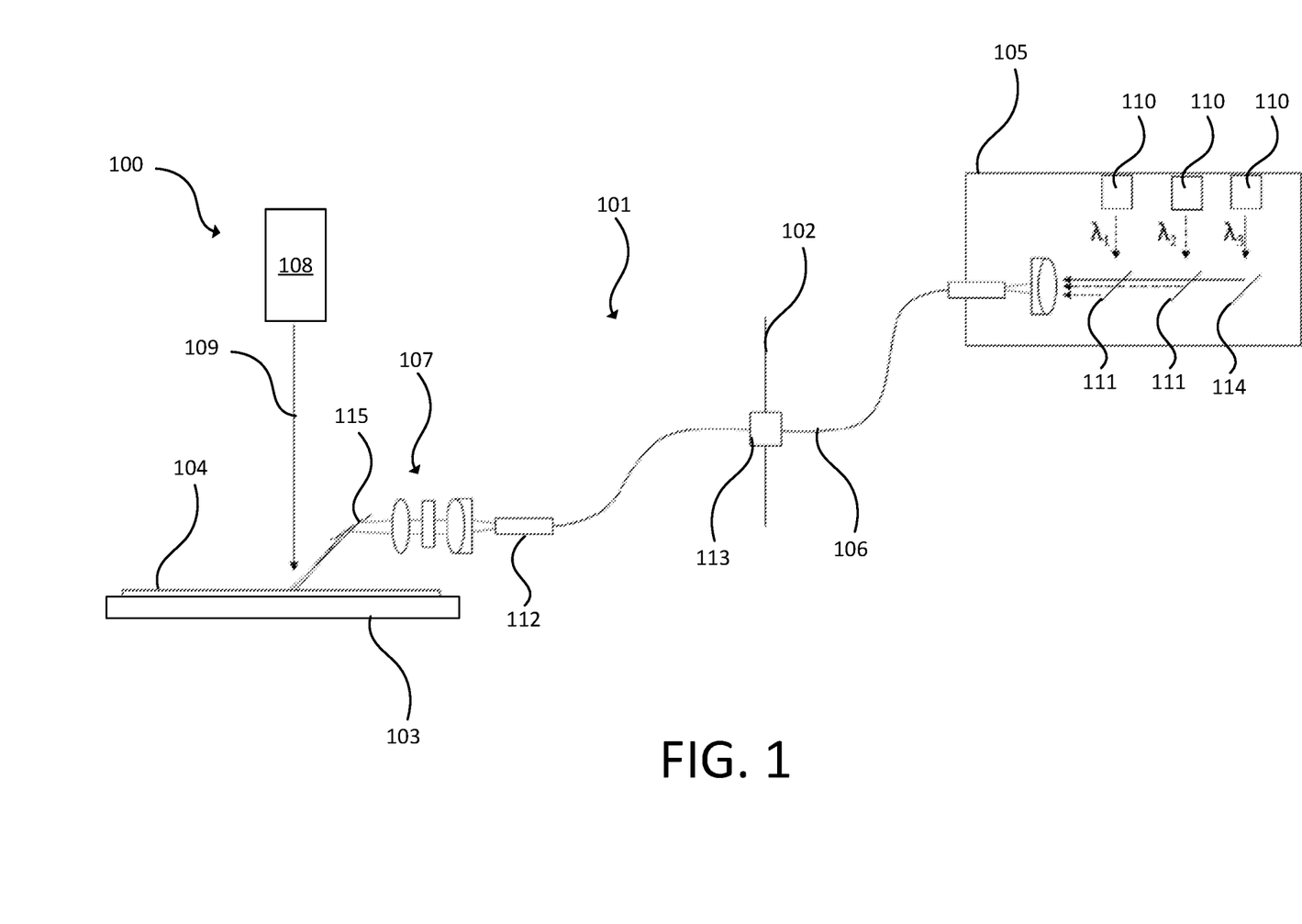
FIG. 1 is an embodiment of a system in accordance with the present disclosure.

FIG. 1 is an embodiment of a system 100. The system 100 uses multi-wavelength fiber delivery for LEVC, which uses a single optical fiber 106 to transmit light in the broad visible spectrum range and at of multiple wavelengths. The system 100 can be scalable. The number of wavelengths through the optical fiber 106 can be increased through, for example, a combination of lasers 110 and dichroic mirrors 111. Laser output power can be controlled electronically using laser current. An attenuator may not be necessary. Thus, no active components may be needed in system 100, which reduces maintenance. Each wavelength of the laser can be electronically activated because the wavelengths can be combined into the single optical fiber 106.

Using a flexible optical fiber 106 to deliver the laser light inside the vacuum chamber 101 can provide additional options when locating components inside the system 100. For example, the optical fiber 106 can be placed next to the acceleration coils, which are proximate the wafer 104. This is not possible without a fiber-guided solution. An illumination angle of approximately 57° or other angles can be achieved, which can enhance the penetration into the wafer.

The system includes a vacuum chamber 101 which is surrounded by a wall 102. A stage 103 in the vacuum chamber 101 is configured to secure a wafer 104. Thus, the stage 103 and wafer 104 can be in region at a vacuum pressure. The vacuum pressure may be less than $10^{-9}$ Torr or less than $10^{-10}$ Torr.

A laser light source 105 is disposed outside the vacuum chamber 101. Thus, the laser light source 105 can be disposed in a region at, for example, atmospheric pressure or near atmospheric pressure. Light from the laser light source 105 can be at more than one wavelength. The laser light source 105 can include one more laser 110 and one or more dichroic mirrors 111.

An optical fiber 106 can transmit all wavelengths of light produced by the laser light source 105 into the vacuum chamber 101. Thus, the optical fiber 106 transmits light from atmosphere to vacuum, which may be over a length of one or more meters. In an instance, the optical fiber 106 is an optical glass fiber. The optical fiber 106 can be a multi-mode fiber or a single-mode fiber.

The optical fiber 106 can be continuous from the laser light source 105 to an output coupler 112 inside the vacuum chamber 101 through the wall 102 of the vacuum chamber 101. The output coupler 112 is a bare fiber end that is sealed into a flange, which mechanically connects the fiber end to other mechanical parts. Thus, no coupling losses apply during the air-vacuum transit. The optical fiber 106 is sealed inside a flange 113.

The system 100 also can include coupling, imaging, and/or illuminating optics to illuminate the wafer 104 with light which exits the optical fiber 106.

In an instance, a polarization-maintained single mode optical fiber 106 is used. The polarization of light emitting the optical fiber 106 is defined and can be reoriented by a wave plate (e.g., half-wave or quarter-wave) to enhance the LEVC effect. Also, the influence of polarization on the LEVC effect of, for example, different tungsten plugs on the wafer can be measured. The linear polarization can also be rotated by rotating the fiber connector at the output of the optical fiber 106 because the optical fiber 106 core shape defines the polarization orientation.

The optical fiber 106 can transmit light at a wavelength from, for example, 400 nm to 680 nm or 400 nm to 700 nm. Other wavelengths are possible and this range is merely one example. The wavelengths can be below 400 nm or up to 2000 nm.

The system 100 also includes an achromatization and polarization unit 107. The achromatization and polarization unit 107 can be positioned in the vacuum chamber 101 and is in the path of light from the optical fiber 106. The achromatization and polarization unit 107 can collimate light received from the optical fiber and/or image the light onto the wafer 104.

The system 100 includes an electron beam source 108 that directs an electron beam 109 at the stage 103. The electron beam source 109 is illustrated in the vacuum chamber 101, but also can be positioned outside the vacuum chamber 101. The electron beam 109 is transported through the vacuum chamber 101, such as toward a wafer 104.

In an embodiment of FIG. 1, laser light sources 105 with three different wavelengths $\lambda_1$, $\lambda_2$, and $\lambda_3$ are combined by dichroic mirrors 111 and highly reflecting mirror 114 before the three different wavelengths are coupled into an optical fiber 106. The optical fiber 106 is continuous and sealed into a flange 113 at the vacuum-air transit. At the output of the fiber 106, achromatized lenses are to collimate light from the optical fiber 106. Polarization control in the polarization unit 107 in the vacuum chamber 101 can be performed with a half-wave plate or quarter-wave plate. The broadband laser beam is directed onto the wafer 104 by a turning mirror 115.

The turning mirror 115 can receive the light from the optical fiber 106 and is configured to direct the light from the optical fiber 106 to the stage 103 or the wafer 104 on the stage 103.

The broadband laser light output inside the vacuum chamber 101 can be achromatized by achromats or a curved mirror. A lens system can be used instead of the curved mirror.

The system 100 can use a working distance of approximately 50 mm from the optics to the surface of the wafer 104, though other distances are possible. This can improve spot stability at the surface of the wafer 104. This reduction in working distance can ease the angular tolerance of the optical beam pointing stability and mirror angle stability by, for example, a factor of six.

Figure 2:
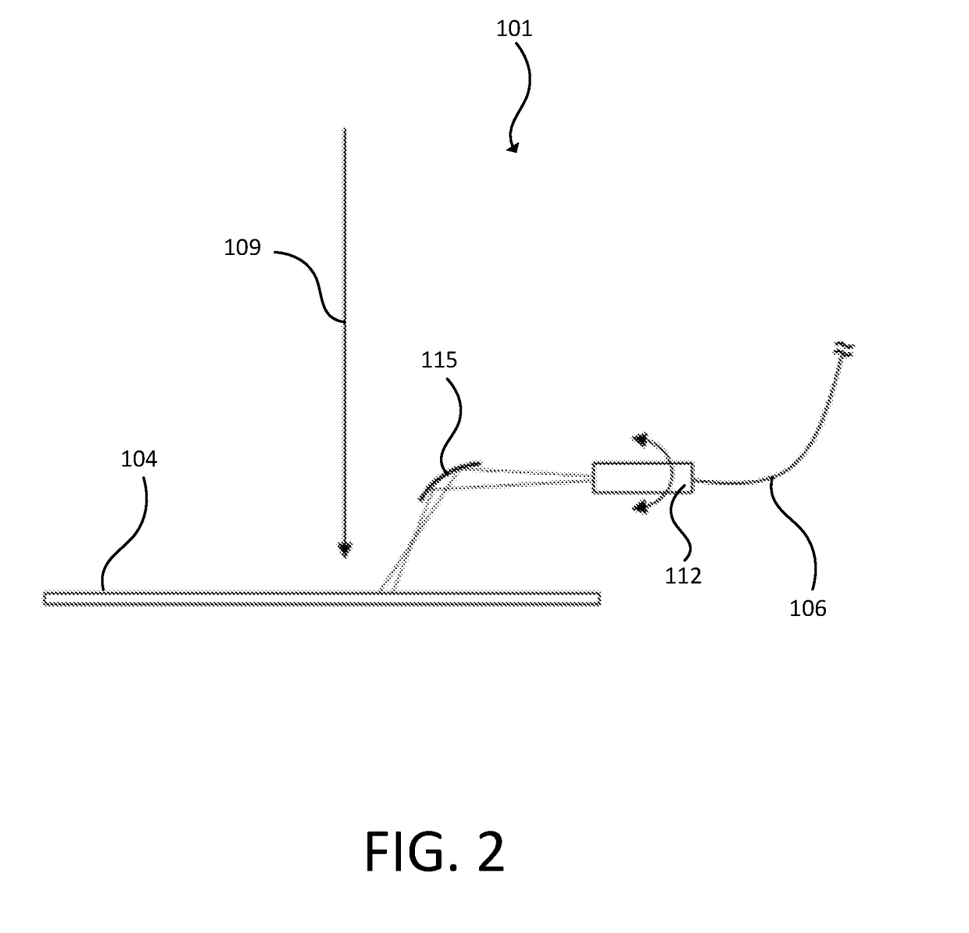
FIG. 2 is an embodiment of wafer illumination using the system of FIG. 1.

FIG. 2 is an embodiment of wafer illumination using the system 100 of FIG. 1. The wafer 104 is illuminated using a turning mirror 115. The turning mirror 115 can be, for example, a spherical or parabolic mirror like that illustrated in FIG. 2. The polarization can be adjusted by rotating the connector of the optical fiber 106 with respect to the output coupler 112. To illuminate the wafer 104 with a desired spot size, magnification of the fiber core onto the wafer 104 can be adjusted.

A "dirty focus-concept" can be used to illuminate the wafer 104. The optical fiber 106 is imaged slightly before the wafer 104. Thus, the light slightly diverges to reach the wafer 104 as shown in FIG. 1 and FIG. 2. This can result in an increased spot at the wafer 104 compared to the diffraction-limited spot size at the focal region. This increased spot size can suit to the desired field of view for the electron beam 109. An adaption of the spot size is also possible by adjusting the position between optical fiber 106 output and a focusing lens or focusing mirror.

Figure 3:
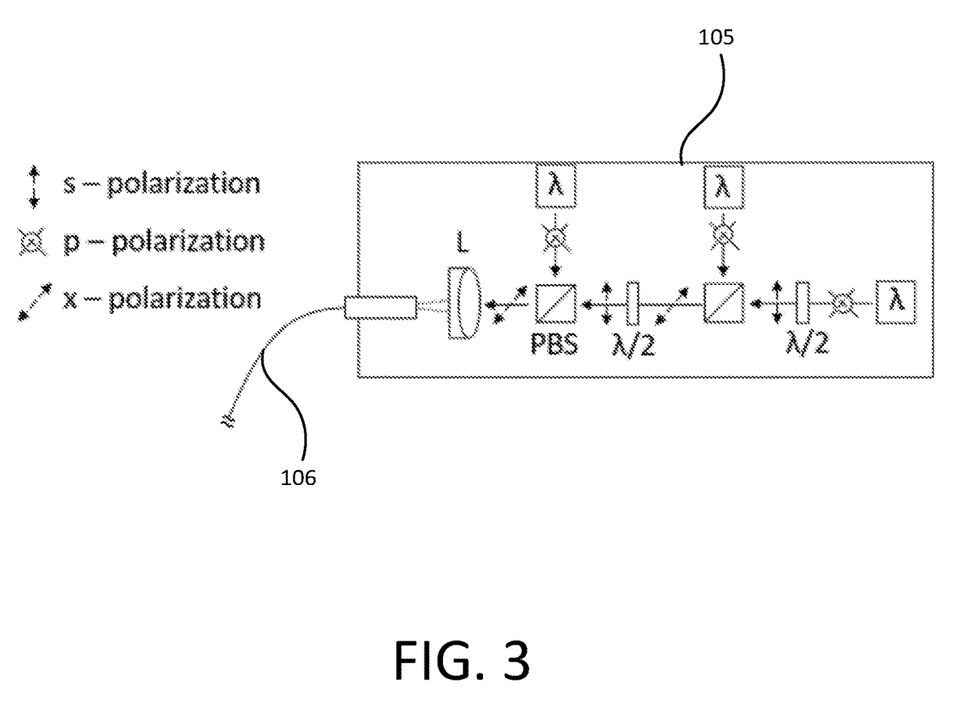
FIG. 3 is an embodiment of a laser light source for the system of FIG. 1.

FIG. 3 is an embodiment of a laser light source 105 for the system 100 of FIG. 1. Laser power guided through the optical fiber 106 can be increased by combining two polarization states into a single optical fiber 106. Laser beams are combined for higher power by adding different polarization states using polarization-dependent beam splitters. FIG. 3 shows the lens L, the polarization dependent beam splitter PBS, half-wave plate $\lambda/2$, and separate lasers and their corresponding polarization states s-, p-, or x-polarization, which is 45° between s- and p-.

The embodiment of FIG. 3 can provide fast and simple electronic switching between the laser wavelengths because all are coupled into one single optical fiber 106. Thus, the throughput of the system is increased because the area can be investigated with multiple wavelengths to optimize LEVC contrast for different defect types. This is realized by tuning the intensities of light at different wavelengths since their relative penetration depths vary by a factor of ten.

Figure 4:
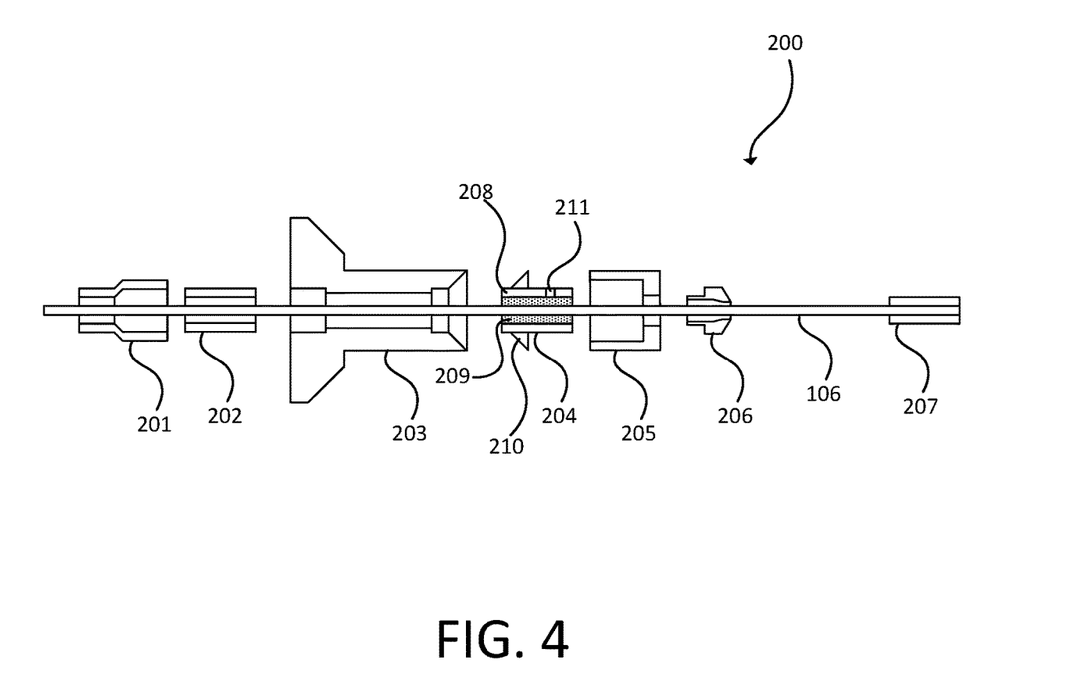
FIG. 4 is a cross-sectional, exploded view of an embodiment of a seal inside a flange that can be used with the system of FIG. 1.
Figure 5:
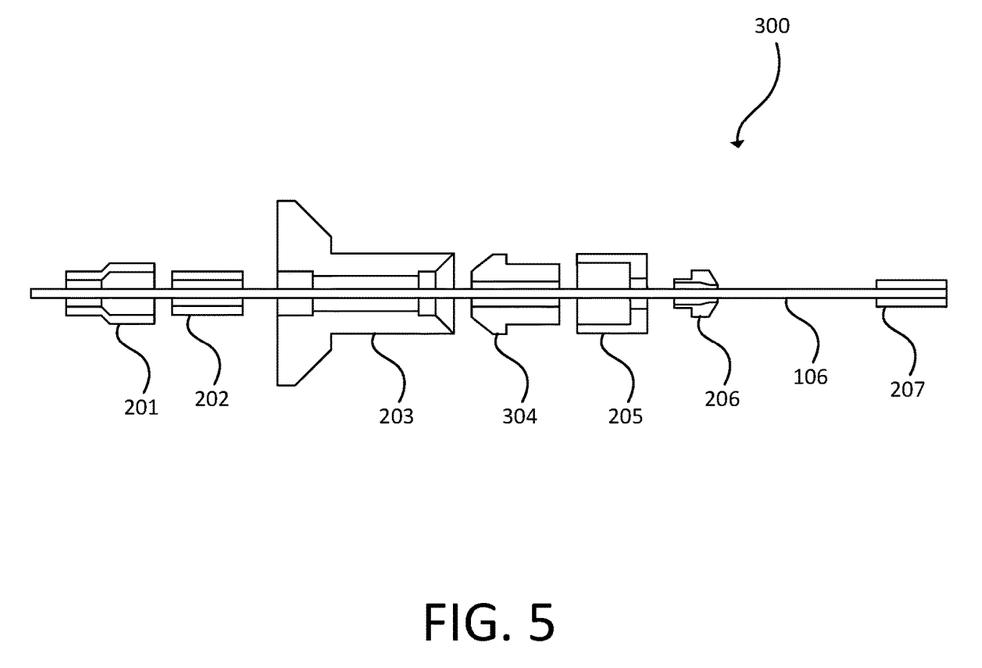
FIG. 5 is a cross-sectional, exploded view of another embodiment of a seal inside a flange that can be used with the system of FIG. 1.

FIG. 4 is a cross-sectional, exploded view of an embodiment of a seal inside a flange 113 that can be used with the system 100 of FIG. 1. FIG. 5 is a cross-sectional, exploded view of another embodiment of a seal inside a flange 113 that can be used with the system 100 of FIG. 1. As seen in FIG. 1, there can be a seal around the optical fiber 106 in the flange 113. The seal and flange 113 can be disposed in a wall of the vacuum chamber 101.

In FIG. 4, the optical fiber 106 passes through the flange 200. The flange 200 is an example of the flange 113 in FIG. 1. The flange 200 includes a strain relief unit 201 and a spacer 202. The spacer 202 is configured to fit inside the strain relief unit 201. The spacer 202 may be made of aluminum or other materials.

The spacer 202 also can be configured to fit inside the seal fitting 203, which can be a Swagelok or other type of seal fitting. The seal fitting 203 can be adapter welded. The seal 204 can be inserted into an end of the seal fitting 203 opposite from the spacer 202. A cover 205 and sleeve 206 also can be included. The sleeve 206 can be stainless steel. A stainless steel tubing 207 can surround the optical fiber 106. The seal fitting 203 may be disposed in the wall 102.

The seal 204 includes an outer component 208, which defines a fill port 211. The fill port 211 can be opened and closed, such as using a nipple. A seal fitting seal 210, which can be fabricated of metal, is disposed on the outer component 208. The seal fitting seal 210 can provide a metal-to-metal seal with the seal fitting 203. Between the outer component 208 and optical fiber 106 is a polymer layer 209. The polymer layer 209 can be inserted into the seal 204 through the fill port 211.

The outer component 208 may be fabricated of Viton or other vacuum-compatible materials with low outgas. The outer component 208 also may be fabricated of aluminum, another metal, or a metal alloy. The polymer layer 209 can be an epoxy. The epoxy can be vacuum-compatible with low outgas.

A hermetic seal between the seal fitting 203 and the seal 204 can be formed using a metal-to-metal seal. For example, seal joints can be replaced by metal-to-metal fusion weld joints to reduce outgassing.

The optical fiber 106 can include a furcation tubing cover inside the elastomer seal 204.

The flange 200 can penetrate the wall of the vacuum chamber 101 without the use of fiber couplings and can provide greater than 90% transmission for wavelengths encompassing ultraviolet to infrared, though other wavelengths are possible. The polarizing extinction rate may be 1:30 or better. Little to no stress may be exerted on the optical fiber 106, which provides the transmission and polarizing extinction rate.

In a test using the embodiment of FIG. 4, transmission of red, green, and blue light was greater than 90%. The polarization extinction ratio was greater than 30.

In FIG. 5, the optical fiber 106 passes through the flange 300. The flange 300 is an example of the flange 113 in FIG. 1. The flange 300 includes an elastomer seal 304 that can be inserted into an end of the seal fitting 203 opposite from the spacer 202. The elastomer seal 304 can be fabricated of Viton or other vacuum-compatible materials with low outgas. The elastomer seal 304 also can be fabricated of silicone.

The optical fiber 106 can include a furcation tubing cover inside the elastomer seal 304.

In an instance, the elastomer seal 304 can be compressed to form a hermetic seal with the seal fitting 203. The axial and radial stress on the optical fiber 106 can be controlled and minimized so that the resulting transmission loss is less than 5% and the polarizing extinction rate is at greater than 1:30.

The embodiment of FIG. 5 can provide greater than 95% transmission for wavelengths encompassing ultraviolet to infrared and a leak rate of less than 2E-10 atm cc/s of helium. Other wavelengths are possible. The embodiments of FIG. 5 can provide an ultra-high vacuum compatible, low loss, polarization-maintaining, single mode fiber vacuum feedthrough.

The hermetic seal to the optical fiber 106 can be accomplished with a two-component polymer sealant between the optical fiber 106 and an inner diameter of a small bore thick wall tube or with a precision-molded elastomer seal 304. A hermetic metal-to-metal seal is provided if the optical fiber 106 is surrounded by the tube. The hermetic seal is provided if the elastomer seal 304 is compressed by a defined amount.

An ultra high vacuum version can be constructed by replacing a quick flange with a crushed copper gasket flange.

The strain relief unit 201 is typically positioned on the vacuum side of the wall that holds the flange 200 or flange 300. The cover 205 and sleeve 206 are typically positioned on the atmosphere side of the wall that holds the flange 200 or flange 300.

The seal fitting 203 can uniformly squeeze the seal 204 or elastomer seal 304. The seal 204 and elastomer seal 304 squeeze the optical fiber 106 when inserted into the collar of the seal fitting 203. The majority or entirety of pressure to the optical fiber 106 is in the radial direction of the optical fiber 106. Axial pressure to the optical fiber 106 is minimized or eliminated, which reduces the possibility of kinks in the optical fiber 106. The optical fiber 106 can generally withstand radial compression.

The optical fiber 106 can be bare within the seal 204 or elastomer seal 304. Thus, the coating or jacket around the optical fiber 106 can be removed. This reduces leaks through the seal 204 or elastomer seal 304. Adhesive may be added where the bare optical fiber 106 meets metal components to further reduce leaks.

The designs of FIGS. 4 and 5 can provide approximately 15% better transmission of red, green, and blue wavelengths compared to previous seal designs. Previous designs applied axial force to the optical fiber 106.

Figure 6:
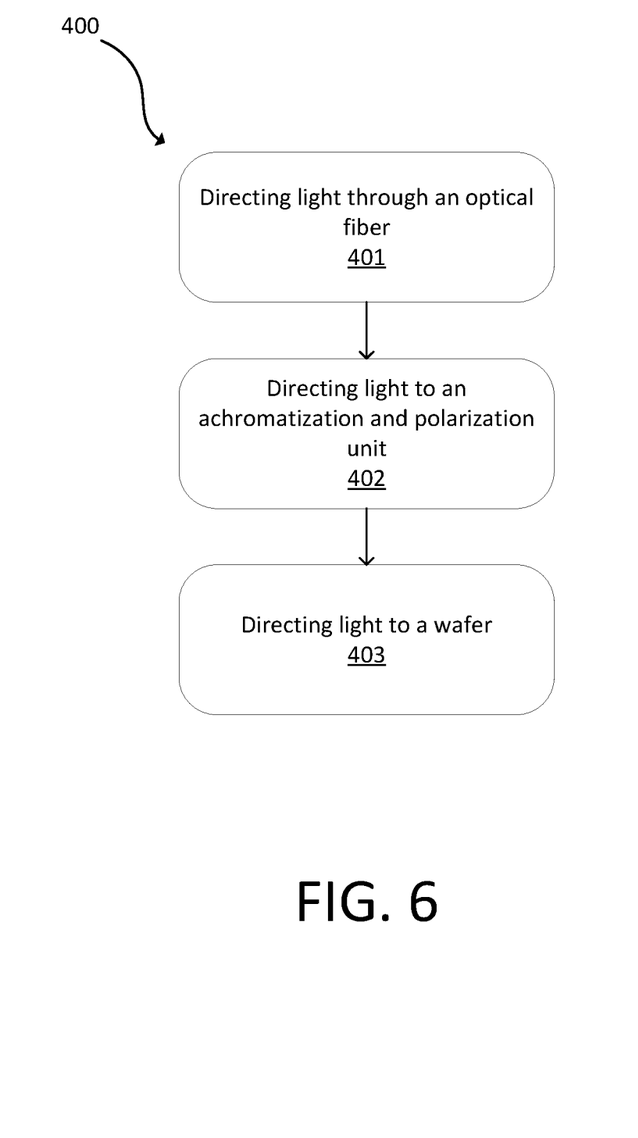
FIG. 6 is a flowchart of an embodiment of a method in accordance with the present disclosure.

FIG. 6 is a flowchart of an embodiment of a method 400, which can occur in the system 100 of FIG. 1. At 401, light from a laser light source is directed to a vacuum chamber through an optical fiber. The optical fiber transmits all wavelengths of light produced by the laser light source into the vacuum chamber. The laser light source may be located outside the vacuum chamber. The light can have a wavelength from 200 nm to 2000 nm, such as from 400 nm to 680 nm.

At 402, the light is directed to an achromatization and polarization unit in the vacuum chamber. The achromatization and polarization unit can include a turning mirror or a curved mirror.

At 403, the light is directed to a wafer secured on a stage disposed in the vacuum chamber.

The method 400 can further include directing an electron beam in the vacuum chamber at the wafer. The electron beam and the light can be directed at the wafer in a synchronized manner.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
   a vacuum chamber;
   a stage disposed in the vacuum chamber that is configured to secure a wafer;
   a laser light source disposed outside the vacuum chamber, wherein the laser light source includes a plurality of lasers;
   an optical fiber that simultaneously transmits all wavelengths of light produced by the laser light source into the vacuum chamber through a wall of the vacuum chamber, wherein the light from the laser light source is at more than one wavelength; and an achromatization and polarization unit disposed in the vacuum chamber, wherein the achromatization and polarization unit receives light from the optical fiber.

2. The apparatus of claim 1, further comprising an electron beam source that directs an electron beam at the stage.

3. The apparatus of claim 1, wherein the optical fiber transmits light at a wavelength from 200 nm to 2000 nm.

4. The apparatus of claim 1, wherein the laser light source further includes a plurality of dichroic mirrors.

5. The apparatus of claim 1, wherein the laser light source further includes a polarization-dependent beam splitter and a plurality of half-wave plates.

6. The apparatus of claim 1, wherein the optical fiber is a multi-mode fiber.

7. The apparatus of claim 1, wherein the optical fiber is a single-mode fiber.

8. The apparatus of claim 1, further comprising a wave plate disposed in the vacuum chamber that receives the light from the optical fiber.

9. The apparatus of claim 8, wherein the wave plate is a half-wave or a quarter-wave plate.

10. The apparatus of claim 1, wherein the achromatization and polarization unit includes:
    a turning mirror disposed in the vacuum chamber, wherein the turning mirror receives the light from the optical fiber and is configured to direct the light from the optical fiber at the stage; and
    at least one achromatized lens disposed in the vacuum chamber, wherein the achromatized lens is configured to collimate the light received from the optical fiber and/or image the light onto the wafer.

11. The apparatus of claim 1, wherein the achromatization and polarization unit includes a curved mirror, wherein the curved mirror is spherical or parabolic.

12. The apparatus of claim 1, further comprising a flange around the optical fiber, wherein the flange is disposed in the wall of the vacuum chamber, and wherein the flange includes:
    an outer component disposed around the optical fiber; and
    a polymer layer disposed between the optical fiber and the outer component, wherein the polymer layer is radially compressed to form a hermetic seal.

13. The apparatus of claim 12, wherein the hermetic seal between the wall and the tube further includes using a metal-to-metal seal.

14. The apparatus of claim 1, further comprising a flange around the optical fiber, wherein the flange is disposed in the wall of the vacuum chamber, wherein the flange is an elastomer seal, and wherein the elastomer seal is radially compressed to form a hermetic seal.

15. A method comprising:
    directing light from a plurality of lasers in a laser light source to a vacuum chamber through an optical fiber, wherein the optical fiber simultaneously transmits all wavelengths of light produced by the laser light source into the vacuum chamber through a wall of the vacuum chamber, wherein the light from the laser light source is at more than one wavelength;
    directing the light from the optical fiber to an achromatization and polarization unit in the vacuum chamber; and
    directing the light to a wafer secured on a stage disposed in the vacuum chamber.

16. The method of claim 15, further comprising directing an electron beam in the vacuum chamber at the wafer.

17. The method of claim 15, wherein the light has a wavelength from 200 nm to 2000 nm.

18. The method of claim 15, wherein the achromatization and polarization unit includes a turning mirror or a curved mirror.

* * * * *